United States Patent
Zhang et al.

(10) Patent No.: US 12,087,583 B2
(45) Date of Patent: Sep. 10, 2024

(54) SEMICONDUCTOR STRUCTURE AND FABRICATION METHOD THEREOF

(71) Applicant: CHANGXIN MEMORY TECHNOLOGIES, INC., Hefei (CN)

(72) Inventors: Shengan Zhang, Hefei (CN); Jen-Chou Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 391 days.

(21) Appl. No.: 17/455,717

(22) Filed: Nov. 19, 2021

(65) Prior Publication Data

US 2022/0076953 A1 Mar. 10, 2022

Related U.S. Application Data

(63) Continuation of application No. PCT/CN2021/095576, filed on May 24, 2021.

(30) Foreign Application Priority Data

Jun. 12, 2020 (CN) .......................... 202010537845.X

(51) Int. Cl.
*H01L 21/033* (2006.01)
*H01L 23/544* (2006.01)

(52) U.S. Cl.
CPC ........ *H01L 21/0337* (2013.01); *H01L 23/544* (2013.01); *H01L 2223/54426* (2013.01)

(58) Field of Classification Search
CPC ............... H01L 21/0337; H01L 23/544; H01L 2223/54426
See application file for complete search history.

(56) References Cited

U.S. PATENT DOCUMENTS

| 2018/0143528 A1* | 5/2018 | Nozawa | .............. H01L 21/0274 |
| 2021/0208497 A1* | 7/2021 | Maeda | ....................... G03F 7/20 |

FOREIGN PATENT DOCUMENTS

| CN | 103246156 A | 8/2013 |
| CN | 104409444 B | 1/2018 |
| CN | 110349906 A | 10/2019 |
| CN | 110648997 A | 1/2020 |
| JP | H11191530 A | 7/1999 |

OTHER PUBLICATIONS

International Search Report as cited in PCT Application No. PCT/CN2021/095576 mailed Aug. 23, 2021, 4 pages.
Written Opinion cited in PCT/CN2021/095576, mailed on Aug. 23, 2021, 6 pages.

* cited by examiner

*Primary Examiner* — Victor A Mandala
*Assistant Examiner* — Colleen E Snow
(74) *Attorney, Agent, or Firm* — Kilpatrick Townsend & Stockton LLP

(57) ABSTRACT

Embodiments of the present application provide a semiconductor structure and a fabrication method thereof. The semiconductor structure includes a substrate; a first mask layer positioned on the substrate, wherein the first mask layer has a plurality of discrete first mask patterns; and a second mask layer positioned on the first mask layer, wherein the second mask layer has a second mask pattern, and at least a part of sidewalls of the second mask pattern is positioned on tops of the first mask patterns.

16 Claims, 3 Drawing Sheets

SEMICONDUCTOR STRUCTURE AND FABRICATION METHOD THEREOF

CROSS-REFERENCE TO RELATED APPLICATIONS

This application is a continuation application of International Patent Application No. PCT/CN2021/095576, filed on May 24, 2021, which claims the right of priority to Chinese Patent Application No. 202010537845.X, filed on Jun. 12, 2020 and entitled "SEMICONDUCTOR STRUCTURE AND FABRICATION METHOD THEREOF", International Patent Application No. PCT/CN2021/095576 and Chinese Patent Application No. 202010537845.X are incorporated herein by reference in their entireties.

TECHNICAL FIELD

Embodiments of the present application relate to the field of semiconductors, and in particular, to a semiconductor structure and a fabrication method thereof.

BACKGROUND

With the development of a fabrication process for an integrated circuit, feature sizes of a lithography process are becoming smaller and smaller. In order to ensure the quality of the lithography process, an alignment system of a lithography machine needs to align a photomask with a wafer before performing lithography. In general, the alignment system of the lithography machine achieves a very small overlay error by measuring a plurality of alignment marks on the wafer, positioning the alignment marks, and calculating an accurate position during exposure.

The quality of the alignment marks influences the alignment precision of the lithography process. Moreover, the alignment marks in the prior art are poor in quality.

SUMMARY

An objective of embodiments of the present application is to provide a semiconductor structure and a fabrication method thereof, to improve the alignment precision of a lithography process.

In order to solve the above technical problems, some embodiments of the present application provide a semiconductor structure, including a substrate; a first mask layer positioned on the substrate, wherein the first mask layer has a plurality of discrete first mask patterns; and a second mask layer positioned on the first mask layer, wherein the second mask layer has a second mask pattern, and at least a part of sidewalls of the second mask pattern is positioned on tops of the first mask patterns.

Correspondingly, some embodiments of the present application further provide a fabrication method for a semiconductor structure, including: providing a substrate; forming a first mask layer with a number of discrete first mask patterns on the substrate; and forming a second mask layer with a second mask pattern on the first mask layer, wherein at least a part of sidewalls of the second mask pattern is positioned on tops of the first mask patterns.

BRIEF DESCRIPTION OF DRAWINGS

One or more embodiments will be exemplarily described by accompanying drawings corresponding to the one or more embodiments. These exemplary descriptions are not intended to limit the embodiments. In these accompanying drawings, like references indicate similar elements. The figures of the accompanying drawings are not drawn to scale unless specifically stated.

DESCRIPTION OF EMBODIMENTS

In order to make the objectives, the technical solutions, and the advantages of embodiments of the present application clearer, the detailed description of the embodiments of the present application is given below in combination with accompanying drawings. Those ordinarily skilled in the art may understand that many technical details are provided in the embodiments of the present application so as to make the readers better understand the present application. However, even if these technical details are not provided and based on a variety of variations and modifications of the following embodiments, the technical solutions sought for protection in the present application may be realized.

Figure 1:
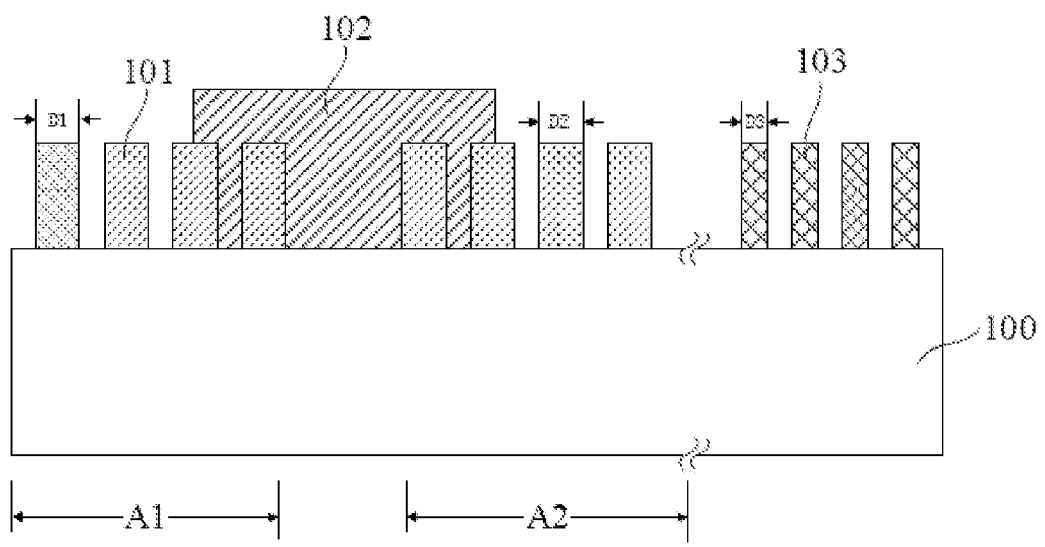
FIG. 1 is a schematic diagram showing a cross-sectional structure of a semiconductor structure according to an embodiment of the present application.

With reference to FIG. 1, a semiconductor structure includes a substrate 100; a first mask layer (not shown) positioned on the substrate 100, wherein the first mask layer has a plurality of discrete first mask patterns 101; and a second mask layer (not shown) positioned on the first mask layer, wherein the second mask layer has a second mask pattern 102, and at least a part of sidewalls of the second mask pattern 102 is positioned on tops of the first mask patterns 101.

The semiconductor structure provided by some embodiments of the present application will be described below in detail in conjunction with accompanying drawings.

The substrate 100 is made of silicon, silicon-on-insulator (SOI), germanium, germanium-silicon or gallium arsenide. The substrate 100 may have been provided with a semiconductor device or an interconnect.

In this embodiment, a plurality of discrete first mask patterns 101 arranged at intervals are disposed in the first region A1 and the second region A2 on the substrate 100. First feature sizes D1 of the first mask patterns 101 in the first region A1 are equal to second feature sizes D2 of the first mask patterns 101 in the second region A2, and the first mask patterns 101 in the first region A1 and the second region A2 are arranged in the same direction. The feature sizes of the first mask patterns 101 refer to widths of the first mask patterns 101 in the arrangement direction. Also, spacings between the first mask patterns 101 refer to feature sizes of openings between the first mask patterns 101, and the feature sizes of the openings refer to widths of the openings in the arrangement direction of the first mask patterns 101.

In this embodiment, the second mask pattern 102 simultaneously covers the first mask patterns 101 at edges of the first region A1 and the second region A2. In some embodiments, in a process for fabricating the first mask patterns 101, for example, a photoresist pattern is formed on the first mask layer in advance, and the first mask layer is etched by utilizing the photoresist pattern to form the first mask patterns 101. Since a diffraction effect of the lithography process causes the pattern quality of the first mask patterns 101 close to the edges of the first region A1 and the second region A2 to be poor, such as edge effects such as size less than a design size and poor line edge roughness, the pattern quality of alignment marks formed subsequently is seriously affected, and the alignment precision is influenced. The second mask pattern 102 is utilized to cover the first mask patterns 101 at the edges of the first region A1 and the second region A2, so that the alignment marks formed subsequently do not include the first mask patterns 101 at the edges of the first region A1 and the second region A2. Accordingly, the quality of the alignment marks is improved.

Figure 2:
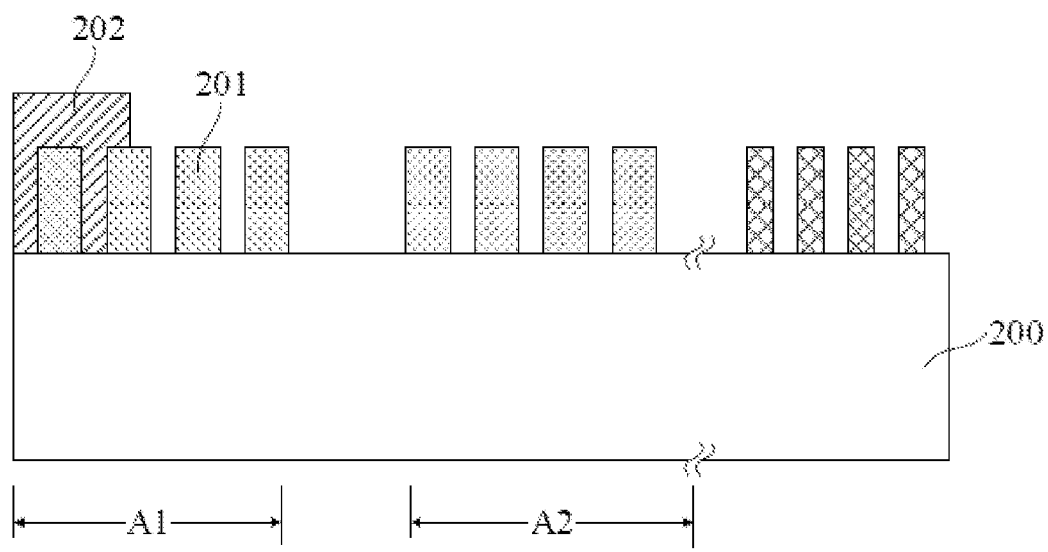
FIG. 2 is a schematic diagram showing a cross-sectional structure of a semiconductor structure according to another embodiment of the present application.

In further embodiments, the second mask layer includes at least two second mask patterns, the two second mask patterns respectively cover the first mask patterns at left and right edges of the first region and the second region. Alternatively, with reference to FIG. 2, the second mask patterns 202 only cover the first mask patterns 101 at the other edge of the first region A1.

In this embodiment, the second mask pattern 102 completely covers the top of at least one first mask pattern 101 in a single region. In other embodiments, the second mask pattern completely covers tops of 2 to 5 first mask patterns in a single region.

The number of the first mask patterns 101 completely covered by the second mask pattern 102 is related to the strength of the edge effect. By adjusting the number of the first mask patterns 101 covered by the second mask pattern 102, it is possible to ensure that position information acquired by an aligning and positioning system is not affected by the edge effect, thereby ensuring the alignment precision of the alignment marks.

In this embodiment, the sidewalls of the second mask pattern 102 are completely positioned on the tops of the first mask patterns 101. In further embodiments, at least a part of the sidewalls of the second mask pattern is positioned on the tops of the first mask patterns.

Since the sidewalls of the second mask pattern 102 are positioned on the tops of the first mask patterns 101, one sidewall of at least one of the first mask patterns 101 covered by the second mask pattern 102 is not covered by the second mask pattern 102, a feature size of an opening between the first mask pattern 101 and the uncovered first mask pattern 101 adjacent to it is equal to that of an opening between two adjacent uncovered first mask patterns 101. As such, when the alignment marks are measured and positioned, it is possible to ensure that the positioning based on positions where sidewalls of any first mask pattern are located is accurate, and the alignment precision of the alignment marks is guaranteed.

Figure 3:
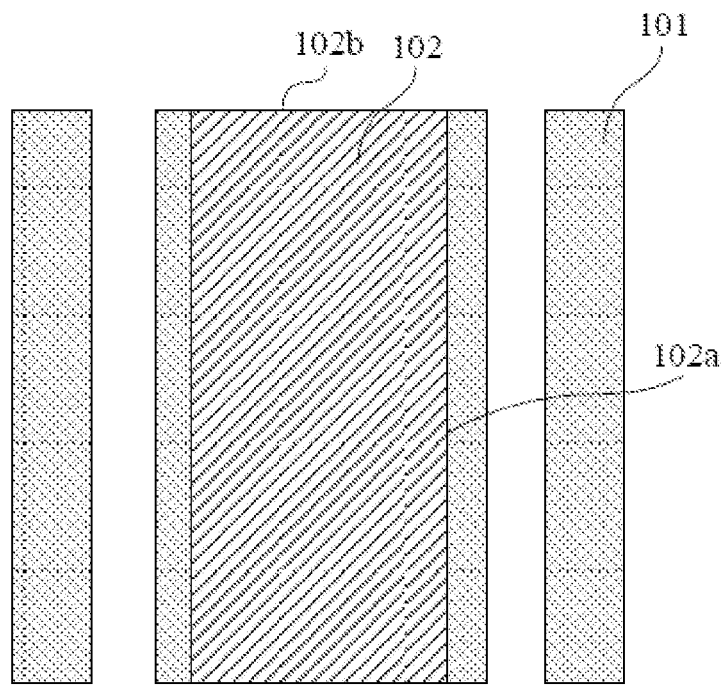
FIG. 3 is a partial top view showing a semiconductor structure shown in FIG. 1.

In this embodiment, with reference to FIG. 3, the sidewalls of the second mask pattern 102 include long-side sidewalls 102a and short-side sidewalls 102b, wherein the long-side sidewalls 102a are completely positioned on the tops of the first mask patterns 101, and the short-side walls 102b span the plurality of first mask patterns 101.

The alignment marks usually are a plurality of elongated patterns arranged at equal intervals. For clarity of illustration, the length of the first mask patterns 101 in an extension direction of FIG. 3 is equal to that of the long-side sidewall 102a of the second mask pattern 102 in the same direction. In practical applications, the length of the first mask patterns 101 in its extension direction and the length of the long-side sidewalls 102a of the second mask pattern 102 in the same direction have no definite size relationship there between, that is, greater than, less than or equal to.

In this embodiment, the first mask layer further has third mask patterns 103, wherein the third mask patterns 103 have third feature sizes D3 greater than or equal to half the first feature sizes D1 of the first mask patterns 101. The first mask patterns 101 generally serve as an alignment mark mask and the third mask patterns 103 generally serve as a device pattern mask, without limitations on practical uses.

In this embodiment, the third feature sizes D3 of the third mask patterns 103 are less than the first feature sizes D1 of the first mask patterns 101, and the first feature sizes D1 of the first mask patterns 101 are greater than spacings between the first mask patterns 101.

In this embodiment, a plurality of third mask patterns 103 arranged at equal intervals are positioned in the first mask layer, and spacings between the third mask patterns 103 are equal to the spacings between the first mask patterns 101.

In this embodiment, since at least a part of the sidewalls of the second mask pattern is positioned on the tops of the first mask patterns, one sidewall of at least one of the first mask patterns covered by the second mask pattern is not covered, a feature size of an opening between the first mask pattern and the uncovered first mask pattern adjacent to it is equal to that of an opening between two adjacent uncovered first mask patterns. As such, when the alignment marks are measured and positioned, it is possible to ensure that the positioning based on positions where sidewalls of any first mask pattern are located is accurate, and the alignment precision of the alignment marks is guaranteed.

Correspondingly, embodiments of the present application further provide a fabrication method for a semiconductor structure, to fabricate the above-mentioned semiconductor structure.

Figure 4:
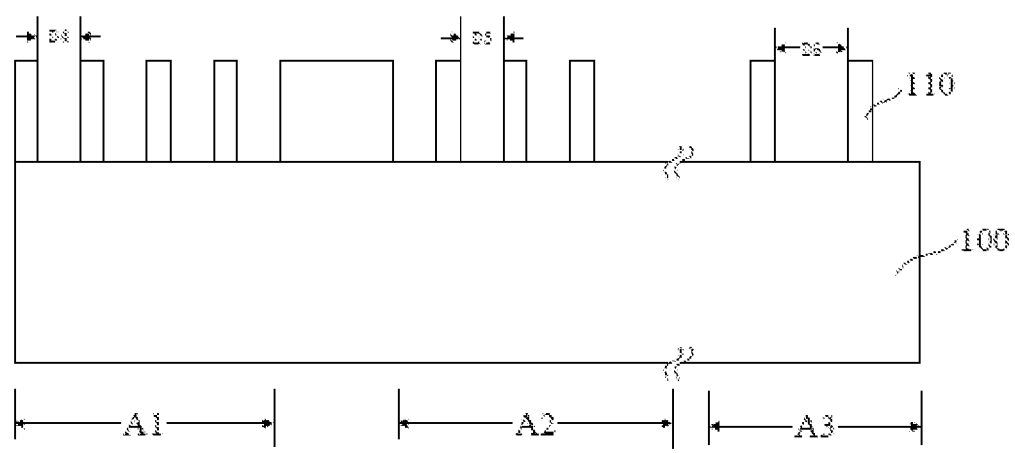
FIG. 4 to FIG. 7 are schematic diagrams showing a cross-sectional structure corresponding to each step of a fabrication method for a semiconductor structure according to an embodiment of the present application.
Figure 5:
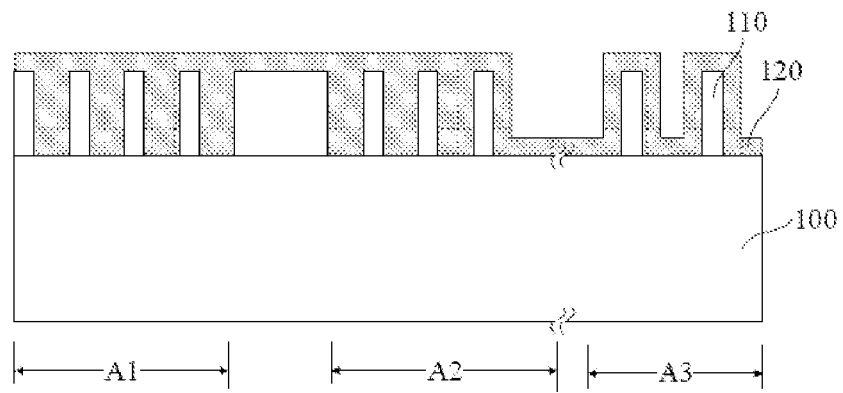
Figure 6:
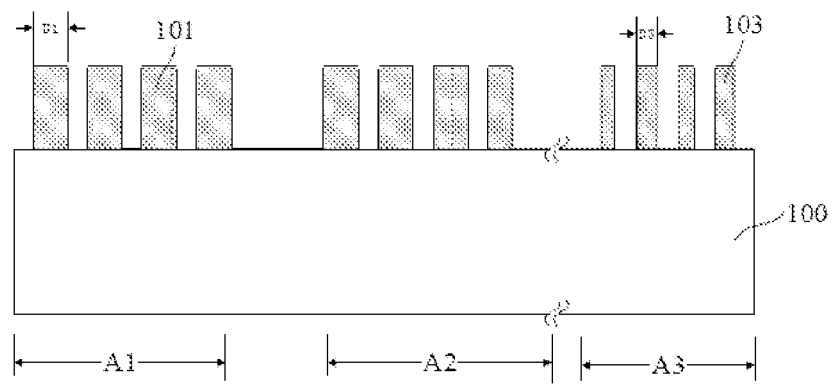

FIG. 4 to FIG. 6 are schematic diagrams showing a cross-sectional structure corresponding to each step of a fabrication method for a semiconductor structure according to an embodiment of the present application.

After the substrate is provided, a first mask layer with a number of discrete first mask patterns is formed on the substrate. Specific subdivision steps are described as follows.

With reference to FIG. 4, a substrate 100 and defining layers on the substrate 100 are provided, wherein the defining layers may be made of common semiconductor dielectric materials, such as silicon oxide, silicon nitride and amorphous carbon.

The defining layers have a plurality of defining patterns 110, and the defining patterns 110 are configured to define feature sizes of the first mask patterns and the third mask patterns that need to be formed subsequently.

In this embodiment, the substrate 100 includes a first region A1, a second region A2 and a third region A3. For example, the first region A1 and the second region A2 are positioned on a scribing lane of the chip, and the third region A3 is positioned in a device region of the chip. The defining patterns 110 in the first region A1, the second region A2 and the third region A3 have the same feature sizes, so that lithography process conditions of the first region A1, the second region A2 and the third region A3 may be simultaneously optimized according to the feature sizes. Accordingly, the complexity of the lithography process is reduced.

In this embodiment, in order to ensure that the mask pattern formed subsequently satisfies the requirements, fourth feature sizes D4 and fifth feature sizes D5 of openings between adjacent defining patterns 110 in the first region A1 and the second region A2 are both less than sixth feature sizes D6 of openings between adjacent defining patterns 110 in the third region A3. The fourth feature sizes D4 and the fifth feature sizes D5 of the openings between adjacent defining patterns 110 in the first region A1 and the second region A2 are the same, and are equal to ⅔ the sixth feature sizes D6 of the opening between adjacent defining patterns 110 in the third region A3. As such, it is possible to enable the sidewall layers formed subsequently to exactly fill the openings between the adjacent defining patterns 110 in the first region A1 and the second region A2, while reducing the spacings between the patterns in the third region A3, so as to achieve the effect of simplifying a fabrication process. Meanwhile, the process window for the subsequently formed second mask pattern on the first mask patterns is enlarged.

With reference to FIG. 5, sidewall layers 120 are formed.

In this embodiment, the sixth feature sizes D6 of the openings between adjacent defining patterns 110 in the third region A3 are greater than the fourth feature sizes D4 of the openings between adjacent defining patterns 110 in the first region A1 and the fifth feature sizes D5 of the openings between adjacent defining patterns 110 in the second region A2. As such, the sidewall layers 120 may fill the openings between the adjacent defining patterns 110 in the first region A1 and the second region A2 while being formed on the sidewalls of the defining patterns 110 in the third region A3. Accordingly the fabrication process is simplified.

Correspondingly, an atomic layer deposition process may be employed to form the sidewall layer 120, and the sidewall layers may be made of common semiconductor dielectric materials, such as silicon oxide and silicon nitride. It should be noted that the sidewall layers are made of the different material from the defining layers and have an etch selectivity ratio.

With reference to FIG. 6, the sidewall layers 120 on the tops of the patterns 110 in the first region A1 and the second region A2 are removed. Meanwhile, the sidewall layers 120 on the tops of the defining patterns 110 in the third region A3 and on the bottoms of the gaps between the defining patterns 110 are removed so as to reserve the sidewall layers 120 on the sidewalls of the defining patterns 110 in the third region A3, and the defining patterns 110 are removed.

In this embodiment, the semiconductor structure shown in FIG. 5 may be etched by employing a maskless dry etching process so as to form the first mask pattern 101 positioned in the first region A1 and the second region A2 and the third mask patterns 103 positioned in the third region A3.

The first mask patterns 101 in the first region A1 and the second region A2 have the same feature sizes, and are arranged at equal intervals in the same arrangement direction. Also, the first feature sizes D1 of the first mask patterns 101 are greater than the third feature sizes D3 of the third mask patterns 103, and the third feature sizes D3 of the third mask patterns 103 are greater than or equal to half the first feature sizes D1 of the first mask patterns 101. As such, the sidewall layers 120 may fill the openings between the adjacent defining patterns 110 in the first region A1 while being formed on the sidewalls of the defining patterns 110 in the third region A3. Accordingly, the effect of the simplifying the fabrication process is achieved. Moreover, the process window for the subsequently formed second mask pattern on the first mask patterns 101 is enlarged.

With reference to FIG. 1, the second mask pattern 102 is formed.

In this embodiment, the second mask pattern 102 partially covers the first mask patterns 101, and at least a part of the sidewalls of the second mask pattern 102 is positioned on the tops of the first mask patterns 101.

In this embodiment, the second mask pattern 102 completely covers the top of one first mask pattern 101 in a single region. In further embodiments, the second mask pattern completely covers tops of a plurality of first mask patterns in a single region, or the second mask pattern completely covers the tops of the plurality of first mask patterns in the plurality of regions. In the fabrication process for the first mask pattern 101, for example, a photoresist pattern is formed on the first mask layer in advance, and the first mask layer is etched by utilizing the photoresist pattern to form the first mask patterns 101. Since a diffraction effect of the lithography process causes the pattern quality of the first mask patterns 101 close to the edges of the first region A1 and the second region A2 to be poor, such as edge effects such as size less than a design size and poor line edge roughness, the pattern quality of alignment marks formed subsequently is seriously affected, and the alignment precision is influenced. The second mask pattern 102 covers the first mask patterns 101 at the edges of the first region A1 and the second region A2, so that the alignment marks formed subsequently do not include the first mask patterns 101 at the edges of the first region A1 and the second region A2. Accordingly, the quality of the alignment marks is improved.

In this embodiment, the sidewalls of the second mask pattern 102 include long-side sidewalls and short-side sidewalls, wherein the long-side sidewalls are completely positioned on the tops of the first mask patterns 101, and the short-side sidewalls span at least one first mask pattern 101 in a single region. The long-side sidewalls are completely positioned on the tops of the first mask patterns 101 to ensure that the sidewalls, which are not covered by the second mask pattern 102, of the first mask patterns may be completely transferred to the substrate 100 to form alignment marks and guarantee the quality of the alignment marks.

In this embodiment, the third feature sizes D3 of the third mask patterns 103 are less than the first feature sizes D1 of the first mask patterns 101, and the first feature sizes D1 of the first mask patterns 101 are greater than the spacings between the first mask patterns 101.

In this embodiment, a plurality of third mask patterns 103 arranged at equal intervals are formed in the first mask layer, and spacings between the third mask patterns 103 are equal to those between the first mask patterns 101.

Figure 7:
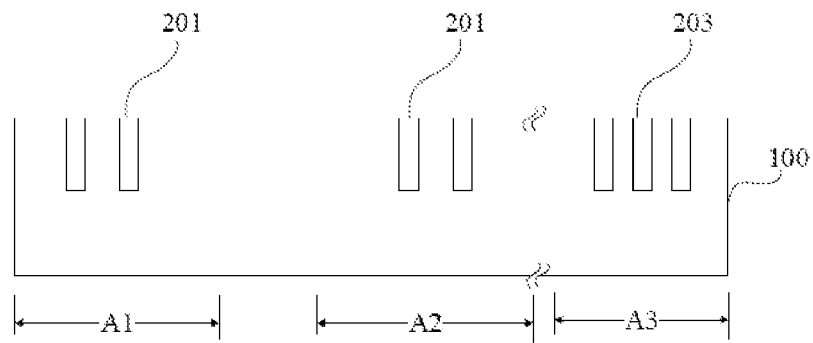

In this embodiment, as shown in FIG. 7, the substrate 100 is etched by utilizing the first mask patterns 101, the second mask pattern 102 and the third mask patterns 103, so as to form alignment marks 201 and device patterns 203 in the substrate 100, respectively.

In this embodiment, since at least a part of the sidewalls of the second mask pattern is positioned on the tops of the first mask patterns, one sidewall of at least one of the first mask patterns covered by the second mask pattern is not covered, a feature size of an opening between the first mask pattern and the uncovered first mask pattern adjacent to it is equal to that of an opening between two adjacent uncovered first mask patterns. As such, when the alignment marks are measured and positioned, it is possible to ensure that the positioning based on positions where sidewalls of any first mask pattern are located is accurate, and the alignment precision of the alignment marks is guaranteed.

In this embodiment, since the feature sizes of the first mask patterns are greater than the spacings between the first mask patterns, a process window for the second mask pattern on the tops of the first mask patterns is enlarged, which further ensures the quality of the alignment marks formed subsequently and improves the alignment precision. Meanwhile, the spacings between the third mask patterns are equal to those between the first mask patterns, so that lithography process conditions for forming the first mask patterns and the third mask patterns may be optimized simultaneously according to the spacings, and the complexity of the process is reduced.

Those ordinarily skilled in the art may understand that the implementations described above are particular embodiments for implementing the present application. In practical uses, various changes in forms and details may be made to the implementations without departing from the spirit and scope of the present application. Any skilled in the art may make their own changes and modifications without departing from the spirit and scope of the present application. Therefore, the protection scope of the present application shall be subject to the protection scope of the claims.

What is claimed is:

1. A semiconductor structure, comprising:
   a substrate;
   a first mask layer, positioned on the substrate, wherein the first mask layer has a plurality of discrete first mask patterns; and
   a second mask layer, positioned on the first mask layer, wherein the second mask layer has a second mask pattern, and
   at least a part of sidewalls of the second mask pattern is positioned on tops of the first mask patterns;
   wherein the first mask layer further has third mask patterns with feature sizes greater than or equal to half of feature sizes of the first mask patterns.

2. The semiconductor structure according to claim 1, wherein the feature sizes of the first mask patterns are the same, and the first mask patterns are arranged in at least two regions on the substrate at equal intervals; and the first mask patterns in the at least two regions are arranged in a same direction.

3. The semiconductor structure according to claim 2, wherein the second mask pattern completely covers the top of at least one of the first mask patterns in a single one of the at least two regions.

4. The semiconductor structure according to claim 3, wherein the second mask pattern completely covers the tops of 2 to 5 of the first mask patterns in a single one of the at least two regions.

5. The semiconductor structure according to claim 3, wherein the sidewalls of the second mask pattern comprise long-side sidewalls and short-side sidewalls, wherein the long-side sidewalls are completely positioned on the tops of the first mask patterns, and the short-side sidewalls span at least another one of the first mask patterns.

6. The semiconductor structure according to claim 1, wherein the feature sizes of the third mask patterns are less than the feature sizes of the first mask patterns, and the feature sizes of the first mask patterns are greater than spacings between the first mask patterns.

7. The semiconductor structure according to claim 6, wherein the third mask patterns arranged at equal intervals are positioned in the first mask layer, and spacings between the third mask patterns are equal to the spacings between the first mask patterns.

8. A fabrication method for a semiconductor structure, comprising:
   providing a substrate;
   forming a first mask layer with a number of discrete first mask patterns on the substrate;
   forming a second mask layer with a second mask pattern on the first mask layer, wherein at least a part of sidewalls of the second mask pattern is positioned on tops of the first mask patterns; and
   forming third mask patterns in the first mask layer, wherein feature sizes of the third mask patterns are greater than or equal to half of feature sizes of the first mask patterns.

9. The fabrication method according to claim 8, wherein the feature sizes of the first mask patterns are the same and the forming the first mask layer with the number of discrete first mask patterns on the substrate comprises: forming the first mask patterns at equal intervals in a plurality of regions on the substrate, wherein the first mask patterns in the plurality of regions are arranged in a same direction.

10. The fabrication method according to claim 9, wherein the second mask pattern completely covers the top of at least one of the first mask patterns in a single one of the plurality of regions.

11. The fabrication method according to claim 10, wherein the sidewalls of the second mask pattern comprise long-side sidewalls and short-side sidewalls, wherein the long-side sidewalls are completely positioned on the tops of the first mask patterns, and the short-side sidewalls span at least another one of the first mask patterns.

12. The fabrication method according to claim 8, wherein the feature sizes of the third mask patterns are less than the feature sizes of the first mask patterns, and the feature sizes of the first mask patterns are greater than spacings between the first mask patterns.

13. The fabrication method according to claim 12, wherein the forming the third mask patterns in the first mask layer comprises: forming the third mask patterns at equal intervals in the first mask layer, and spacings between the third mask patterns are equal to the spacings between the first mask patterns.

14. The fabrication method according to claim 13, wherein the substrate is etched by utilizing the first mask patterns, the second mask pattern and the third mask patterns so as to form alignment marks and device patterns in the substrate, respectively.

15. The fabrication method according to claim 8, wherein the forming the third mask patterns in the first mask layer comprises:
    forming defining layers with a plurality of defining patterns on a first region, a second region and a third region of the substrate, wherein spacings between the defining patterns in the first region and the second region are less than spacing between the defining patterns in the third region;
    forming sidewall layers on the defining patterns;
    removing the sidewall layers on tops of the defining patterns in the first region and the second region;
    removing the sidewall layers on tops of the defining patterns in the third region and on bottoms of gaps between the defining patterns, so as to reserve the sidewall layers on sidewalls of the defining patterns in the third region;
    removing the defining patterns; and
    forming the first mask patterns by the sidewall layers reserved in the first region and the second region, and forming the third mask patterns by the sidewall layers reserved in the third region.

16. The fabrication method according to claim 15, wherein feature sizes of openings between the defining patterns in the first region and the second region are ⅔ of feature sizes of openings between the defining patterns in the third region.

\* \* \* \* \*